United States Patent
Lee et al.

(10) Patent No.: US 7,294,519 B2
(45) Date of Patent: Nov. 13, 2007

(54) SEMICONDUCTOR LIGHT-EMITTING DEVICE AND METHOD OF MANUFACTURING THE SAME

(75) Inventors: Jong Soo Lee, Iksan (KR); Min Sang Lee, Daegu (KR); Young Ki Lee, Pohang (KR)

(73) Assignee: Luxpia Co., Ltd., Jeollabuk-do (KR)

( * ) Notice: Subject to any disclaimer, the term of this patent is extended or adjusted under 35 U.S.C. 154(b) by 160 days.

(21) Appl. No.: 11/154,559

(22) Filed: Jun. 17, 2005

(65) Prior Publication Data

US 2006/0118794 A1    Jun. 8, 2006

(30) Foreign Application Priority Data

Dec. 8, 2004    (KR)    ...................... 10-2004-0103164

(51) Int. Cl.
*H01L 21/00*    (2006.01)

(52) U.S. Cl. .......................... 438/39; 438/44; 977/938; 257/E31.058; 257/E25.032

(58) Field of Classification Search .................. 438/41, 438/44, 39, 2; 977/938; 257/E31.058, E31.063, 257/E31.115, E25.032

See application file for complete search history.

(56) References Cited

U.S. PATENT DOCUMENTS

2006/0223211 A1*   10/2006   Mishra et al. ................. 438/41
2007/0034888 A1*    2/2007   Bader et al. ................... 257/98

* cited by examiner

*Primary Examiner*—Howard Weiss
*Assistant Examiner*—(Vikki) Hoa B. Trinh
(74) *Attorney, Agent, or Firm*—Rothwell, Figg, Ernst & Manbeck

(57) ABSTRACT

Provided are a semiconductor light-emitting device having nano-needles and a method of manufacturing the same. The provided semiconductor light-emitting device improves the extraction efficiency of photons, and includes a gallium nitride (GaN) group multi-layer and nano-needles grown on the GaN group multi-layer. The nano-needles improve the extraction efficiency of photons.

12 Claims, 4 Drawing Sheets

SEMICONDUCTOR LIGHT-EMITTING DEVICE AND METHOD OF MANUFACTURING THE SAME

BACKGROUND OF THE INVENTION

This application claims the priority of Korean Patent Application No. 10-2004-0103164, filed on Dec. 8, 2004, in the Korean Intellectual Property Office, the disclosure of which is incorporated herein in its entirety by reference.

1. Field of the Invention

The present invention relates to a semiconductor light-emitting device and a method of manufacturing the same, and more particularly, to a semiconductor light-emitting device and a method of manufacturing the same which improve light-emitting efficiency by growing nano-needles on a gallium nitride (GaN) group multi-layer.

2. Description of the Related Art

Light-emitting efficiency is one of the important criteria for determining the performance of a semiconductor light-emitting device. The light-emitting efficiency is determined based on an internal quantum efficiency, an extraction efficiency, and the operation voltage. The extraction efficiency is the ratio of the amount of photons extracted from a light-emitting device to the amount of photons generated by the light-emitting device.

GaN group semiconductors, which are generally used for semiconductor light-emitting devices, have studied for the use of a photoelectronic device, such as a blue light-emitting device or a laser diode.

Referring to FIG. 1, a semiconductor light-emitting device includes an electron doped n-type cladding layer 110, a hole doped p-type cladding layer 112, an active layer 111, between the n-type cladding layer 110 and the p-type cladding layer 112, in which photons are generated by combining electrons and holes, provided respectively by the n-type cladding layer 110 and the p-type cladding layer 112, and a window layer 113 through which the generated photons pass. In addition, a first electrode layer 114 and a second electrode layer 115 are arranged respectively on the upper surface 117 and the lower surface of the semiconductor light-emitting device. The first electrode layer 114 is formed on the portion of the upper surface 117 through which the photons are extracted.

When applying a forward bias of a positive voltage to the first electrode layer 114 and a negative voltage to the second electrode layer 115, the electrons and the holes are transferred from the n-type cladding layer 110 and the p-type cladding layer 112 to the active layer 111, where they combine together to generate photons having an energy corresponding to an energy band gap. The photons generated in the active layer 111 diverge in random directions, and thus many are absorbed by the chip or exit in the different direction other than the upper surface after being repeatedly reflected. Examples of methods for improving the extraction efficiency by preventing photons from being absorbed by a chip and helping the photons escape to the outside will now be described.

A light-emitting diode multi-layer is usually deposited on a sapphire substrate, which is a dielectric material with bad electric and thermal characteristics. This reduces the extraction efficiency. In addition, the sapphire substrate has a different crystalline structure from a GaN multi-layer, making it difficult to grow a layer. Furthermore, the sapphire substrate traps heat when packaging the light-emitting diode chip, thus damaging the light-emitting chip and lowering the luminance of the chip. Accordingly, attempts have been made to improve the extraction efficiency by removing the sapphire substrate after growing the multi-layer.

After separating the sapphire substrate, gallium nitride remains on the multi-layer and is thermally decomposed into gallium and nitrogen. Thus, the nitrogen evaporates and the gallium remains on the multi-layer. The remaining gallium contaminates the multi-layer and reduces the light-emitting efficiency. The gallium can be removed by chemical etching with HCl, but this can damage the multi-layer.

In addition, attempts have been made to improve the extraction efficiency by roughening the upper surface of the light-emitting device using photoelectronic chemical etching. However, this requires an additional process after depositing the multi-layer, and can damage the GaN layer.

SUMMARY OF THE INVENTION

The present invention provides a semiconductor light-emitting device which improves photon extraction efficiency by growing nano-needles on a multi-layer.

The present invention also provides a method of manufacturing a semiconductor light-emitting device which simplifies the manufacturing process while avoiding damage to a multi-layer by using gallium remaining on the multi-layer as a catalyst when growing nano-needles on the multi-layer.

According to an aspect of the present invention, there is provided a semiconductor light-emitting device which improves the extraction efficiency of photons, comprising a gallium nitride (GaN) group multi-layer and nano-needles formed on the GaN group multi-layer.

The GaN group multi-layer may include an n-type GaN semiconductor layer, an active layer, and a p-type GaN semiconductor layer.

The nano-needles may be formed in a cone shape.

The nano-needles may be formed on the n-type GaN semiconductor layer.

A conductive substrate may be further formed on a surface of the multi-layer other than the surface having the nano-needles.

According to another aspect of the present invention, there is provided a method of manufacturing a semiconductor light-emitting device, comprising growing a GaN group multi-layer on a sapphire substrate, separating the sapphire substrate from the GaN group multi-layer, and growing nano-needles on the GaN group multi-layer.

The nano-needles may be grown using gallium remaining on the multi-layer as a catalyst, after separating the sapphire substrate from the multi-layer.

The GaN group multi-layer may be located in a horizontal electric furnace and an ammonia carrier gas may be supplied to the horizontal electric furnace to cause the gallium remaining on the GaN group multi-layer to react with nitrogen of the ammonia gas, when growing the nano-needles.

The growing direction, growing angle, and growing length of the nano-needles may be controlled by adjusting at least one of the vacuum and temperature of the horizontal electric furnace and the flow rate and reaction time of the ammonia gas, when growing the nano-needles.

The nano-needles may be grown for 10 to 30 minutes.

The vacuum of the horizontal electric furnace may be maintained at 200 to 400 torr.

The nano-needles may be grown at a temperature of 400 to 700° C.

The method may further comprise depositing a conductive substrate on the GaN group multi-layer, before or after separating the sapphire substrate from the GaN group multi-layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown.

Figure 1:
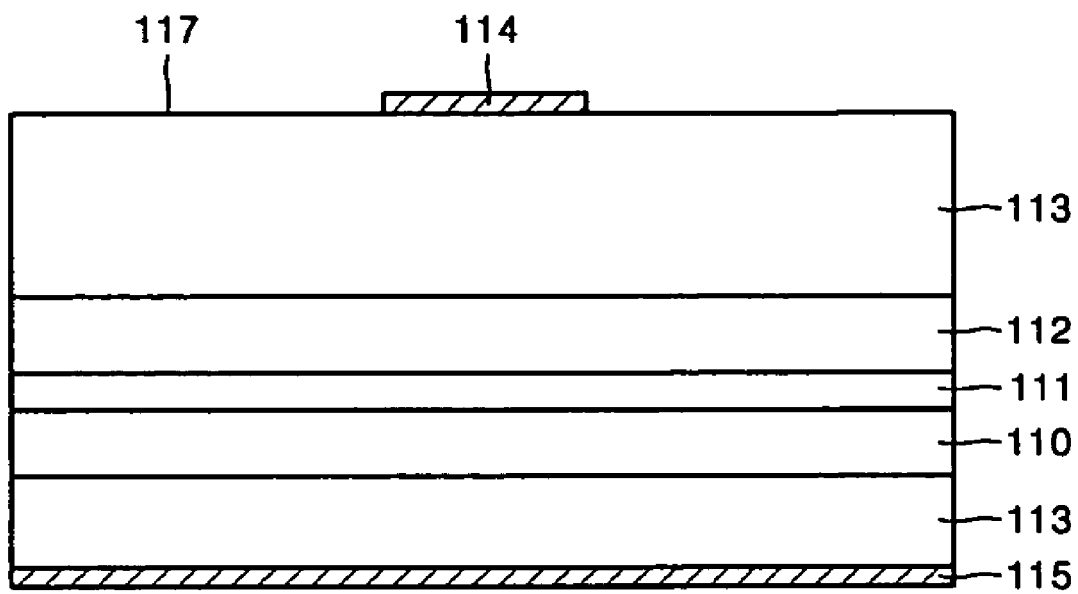
FIG. 1 is a sectional view of a conventional light-emitting device.
Figure 2:
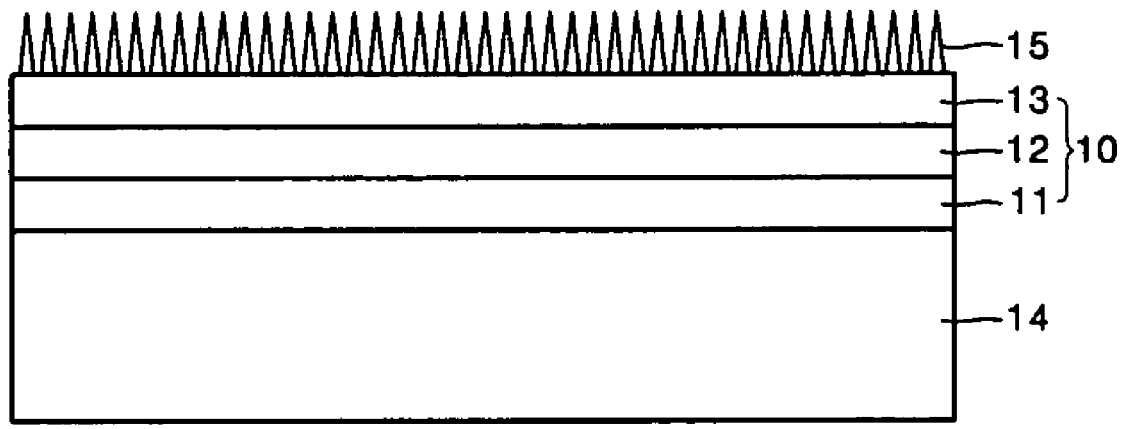
FIG. 2 is a sectional view of a light-emitting device having nano-needles according to an embodiment of the present invention.

FIG. 2 is a sectional view of a semiconductor light-emitting device according to an embodiment of the present invention. Referring to FIG. 2, a semiconductor light-emitting device according to the present invention includes nano-needles 20 formed on a multi-layer 10, and a conductive substrate 14 formed under the multi-layer 10.

The multi-layer 10 is formed of a gallium nitride (GaN) group material to form a light-emitting diode (LED) or a laser diode. The multi-layer 10 may include a p-type GaN semiconductor layer 11, an active layer 12, and an n-type GaN semiconductor layer 13. The active layer 12 may be formed of InGaN. In this case, the band gap energy of the active layer 12 is determined based on the composition of In, allowing wavelengths from ultraviolet through red to be obtained.

The nano-needles 20 are formed on the n-type GaN semiconductor layer 13, and the conductive substrate 14 is formed on the p-type GaN semiconductor layer 11.

The conductive substrate 14 may be formed of silicon, or a metal having excellent thermal and electric characteristics. Since the conductive substrate 14 has excellent conductivity, current may be excellently supplied to improve the supply of holes. In addition, since the conductive substrate 14 has excellent thermal characteristics, heat is excellently emitted, to improve the light-emitting efficiency while preventing damage to the light-emitting device chip.

Holes from the p-type GaN semiconductor layer 11 react with electrons from the n-type GaN semiconductor layer 13 to generate photons, which are extracted through nano-needles 20 formed on the multi-layer 10. The nano-needles 20 are formed in a cone shape of a GaN group material, and improve the extraction efficiency of the photons.

A method of manufacturing a semiconductor light-emitting device having nano-needles according to an embodiment of the present invention will now be described.

Figure 3A:
FIGS. 3A through 3C are sectional views illustrating the manufacturing process of a light-emitting device having nano-needles according to an embodiment of the present invention.
Figure 3B:
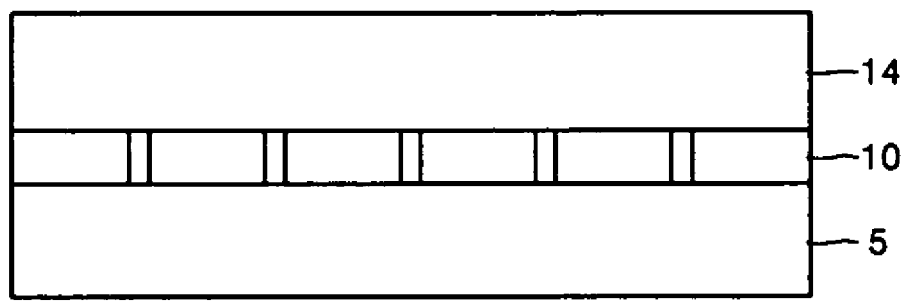
Figure 3C:
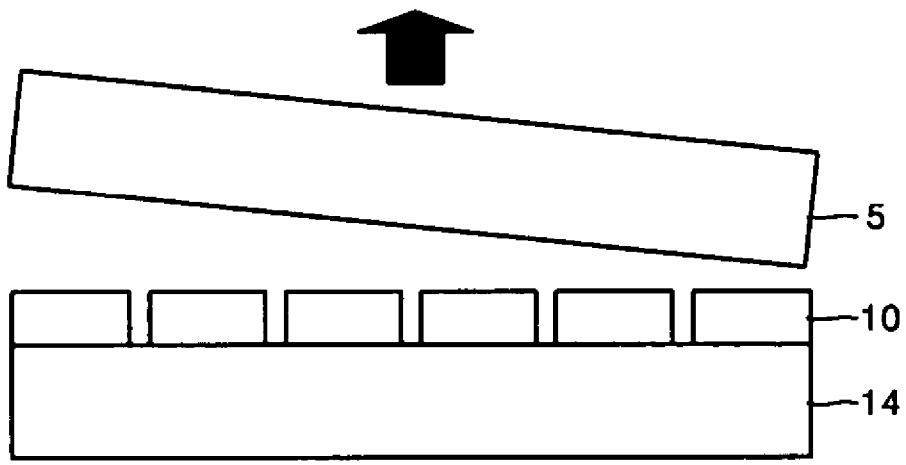

Referring to FIG. 3A, a GaN group multi-layer 10 is formed on a sapphire substrate 5, and the GaN group multi-layer 10 is scribed into chip units. In this case, the GaN group multi-layer 10 may be formed in the structure shown in FIG. 2. More specifically, an n-type GaN semiconductor layer 13, an active layer 12, and a p-type GaN semiconductor layer 11 are sequentially deposited on the sapphire substrate 5. Thereafter, a conductive substrate 14 is deposited on the p-type GaN semiconductor layer of the multi-layer 10, as shown in FIG. 3B. Then, the sapphire substrate 5 is separated from the multi-layer 10 by a laser lift-off method, as shown in FIG. 3C.

The laser used to separate the sapphire substrate 5 has a specific wavelength which does not affect the optical and electrical characteristics of the multi-layer 10, for example, 248 to 355 nm. The laser is irradiated onto the sapphire substrate 5, which is then separated from the multi-layer 10 after a thermal analysis process.

The conductive substrate 14 formed of metal or silicon may be deposited before or after separating the sapphire substrate 5 from the multi-layer 10. In other words, before the conductive substrate 14 is deposited on the multi-layer 10, the multi-layer 10 can be scribed into chip units as shown in FIG. 3A and the sapphire substrate 5 separated from the multi-layer 10 using a laser. Thereafter, the conductive substrate 14 may be deposited on the multi-layer 10 in a free-standing state.

Figure 4A:
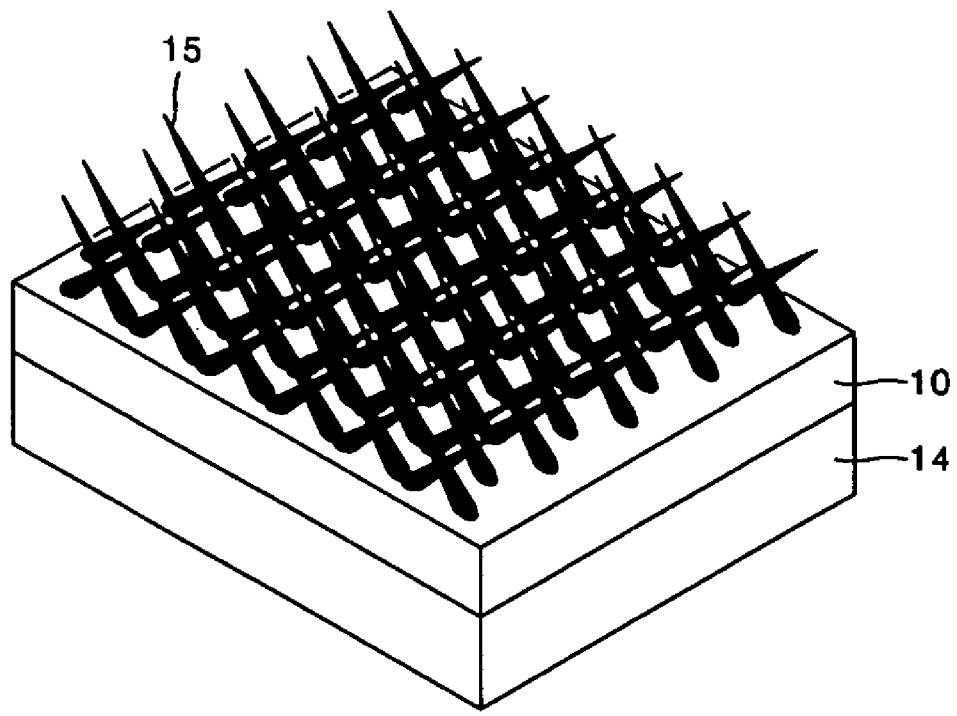
FIGS. 4A and 4B are perspective views of nano-needles of a light-emitting device according to embodiments of the present invention.
Figure 4B:
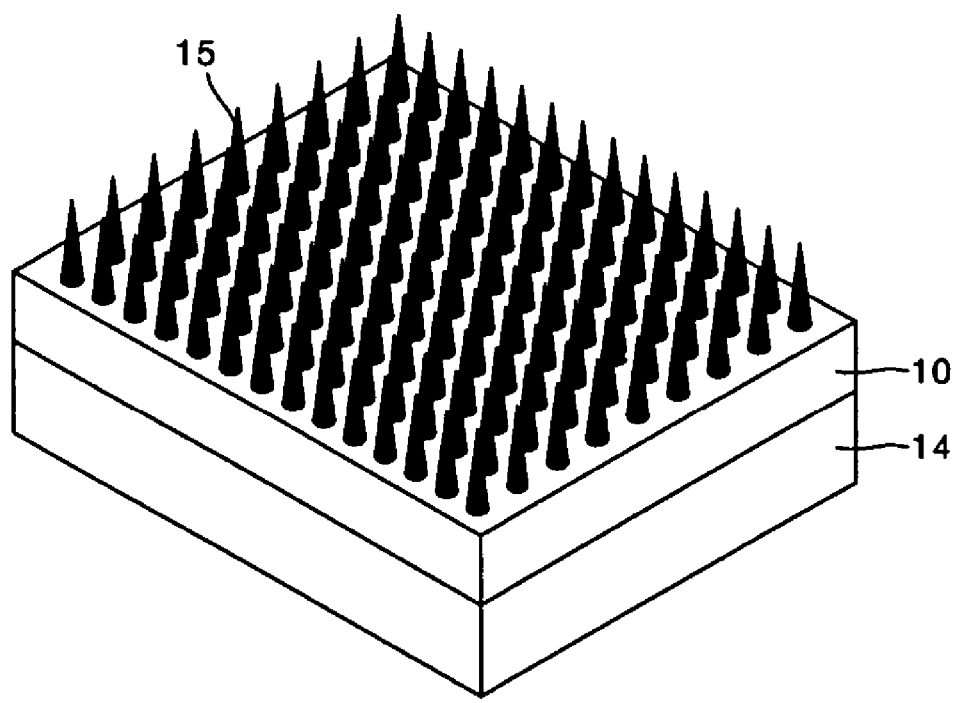

Then, GaN group nano-needles 15 are grown on the multi-layer 10 as shown in FIGS. 4A and 4B. More specifically, a mixture of Ga powder and GaN powder at a predetermined ratio is input to the center of a horizontal electric furnace, and the multi-layer 10 is located at an exhaust outlet of the horizontal electric furnace. Then, an ammonia carrier gas flows at a temperature of 400 to 700° C., allowing the gallium to react with nitrogen of the ammonia gas to form the GaN nano-needles 15.

In this case, gallium remains on the multi-layer 10 after the sapphire substrate 5 is lifted off using a laser. The GaN nano-needles 15 are grown using this remaining gallium as a catalyst. The nano-needles 15 may be grown on the n-type GaN semiconductor layer of the multi-layer 10. In this case, the growing direction, angle, and length of the nano-needles 15 may be controlled by adjusting the vacuum and temperature of the horizontal electric furnace, and the flow rate and reaction time of the ammonia gas. The nano-needles 15 may be grown for 10 to 30 minutes, and the vacuum of the horizontal electric furnace may be controlled from 200 to 400 torr. FIG. 4A illustrates inclined nano-needles 15, and FIG. 4B illustrates straight nano-needles 15. When the nano-needles 15 are grown straight, the extraction efficiency of photons is maximized.

In the present invention, gallium which remains on a multi-layer, after a laser lift-off of a sapphire substrate, is used as a catalyst for growing nano-needles. Accordingly, the process of removing the gallium from the multi-layer may be omitted, avoiding damage to the multi-layer. In addition, the extraction efficiency of photons may be significantly improved by growing the nano-needles using the gallium which remains on the multi-layer.

Figure 5A:
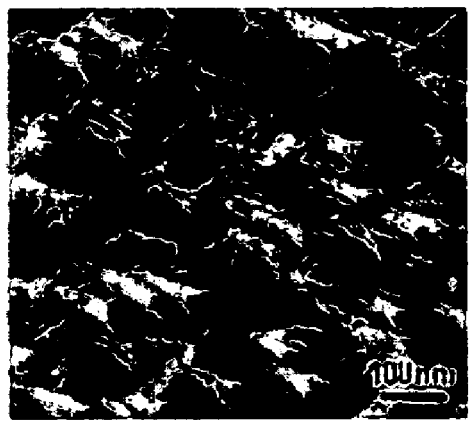
FIG. 5A is an electron microscope photograph of nano-needles of FIG. 4A according to a first embodiment of the present invention.
Figure 5B:
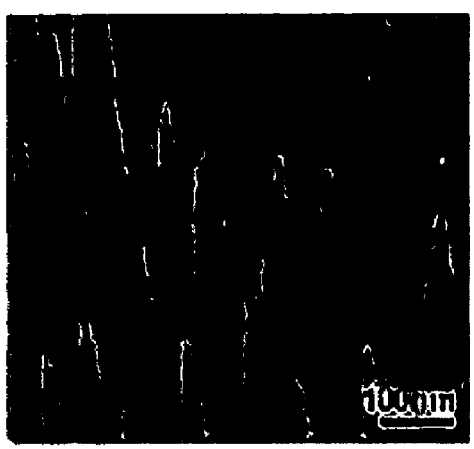
FIG. 5B is an electron microscope photograph of nano-needles of FIG. 4B according to a second embodiment of the present invention.
Figure 5C:
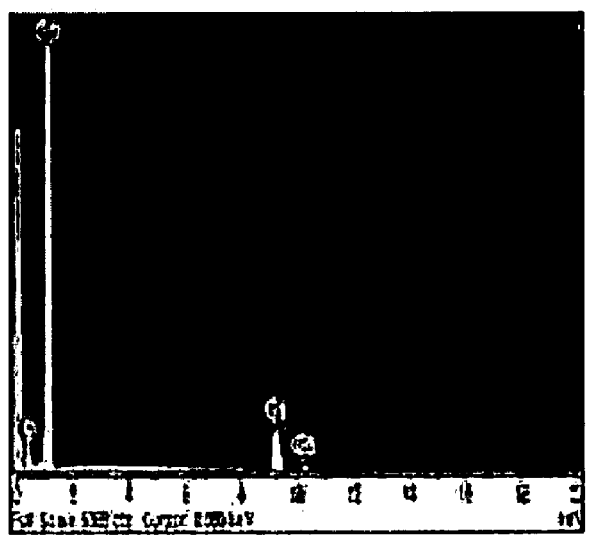
FIG. 5C illustrates the results of an energy dispersive X-ray spectrometer analysis of nano-needles of a light-emitting device according to an embodiment of the present invention.

FIGS. 5A and 5B are electronic microscope photographs of GaN nano-needles which are selectively formed by thermal chemical deposition. Referring to FIGS. 5A and 5B, nano-needles having a diameter of less than 80 nm are selectively and regularly grown. In addition, FIG. 5C illustrates the results of an energy dispersive X-ray spectrometer analysis of nano-needles formed of gallium and nitrogen.

The method of growing nano-needles on a multi-layer according to the embodiment of the present invention grows the nano-needles on the multi-layer after removing the sapphire substrate 5 from the multi-layer 10; however, the sapphire substrate may be left attached, and the nano-needles may be grown on the sapphire substrate. This achieves better extraction efficiency than a conventional light-emitting device without nano-needles, but less than the case of growing the nano-needles after removing the sapphire substrate.

As described above, nano-needles are grown on a GaN group LED multi-layer or LD multi-layer, to improve the extraction efficiency of photons.

In addition, the nano-needles are grown on the multi-layer using gallium remaining on the multi-layer as a catalyst, after removing a sapphire substrate from the multi-layer. Thus, no additional process is required to remove the remaining gallium, and the extraction efficiency of photons may be maximized by controlling the growing conditions of the nano-needles.

A white light source having an efficiency high enough for vehicle headlamps and household light sources may be provided by using a semiconductor light-emitting device according to the embodiment of the present invention.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a semiconductor light-emitting device, the method comprising:
    growing a GaN group multi-layer on a sapphire substrate, wherein the GaN group multi-layer is located in a horizontal electric furnace and an ammonia carrier gas is supplied to the horizontal electric furnace to cause the gallium remaining on the GaN group multi-layer to react with nitrogen of the ammonia gas, when growing the nano-needles;
    separating the sapphire substrate from the GaN group multi-layer; and
    growing nano-needles on the GaN group multi-layer.

2. The method of claim 1, wherein the nano-needles are grown using gallium remaining on the multi-layer as a catalyst, after separating the sapphire substrate from the multi-layer.

3. The method of claim 1, wherein the GaN group multi-layer includes an n-type GaN semiconductor layer, an active layer, and a p-type GaN semiconductor layer.

4. The method of claim 3, wherein the nano-needles are formed on the n-type GaN semiconductor layer.

5. The method of claim 1, wherein the growing direction, growing angle, and growing length of the nano-needles are controlled by adjusting at least one of the vacuum and temperature of the horizontal electric furnace and the flow rate and reaction time of the ammonia gas, when growing the nano-needles.

6. The method of claim 1, wherein the nano-needles are grown for 10 to 30 minutes.

7. The method of claim 1, wherein the vacuum of the horizontal electric furnace is maintained at 200 to 400 torr.

8. The method of claim 1, wherein the nano-needles are grown at a temperature of 400 to 700° C.

9. The method of claim 1, wherein the nano-needles are formed in a cone shape.

10. The method of claim 1, wherein the sapphire substrate is separated from the multi-layer using a laser lift-off method.

11. The method of claim 10, wherein the laser used in the laser lift-off method has a wavelength of 248 to 355 nm.

12. The method of claim 1, further comprising depositing a conductive substrate on the GaN group multi-layer before or after separating the sapphire substrate from the GaN group multi-layer.

* * * * *